(12) United States Patent
Lynch et al.

(10) Patent No.: US 8,986,866 B2
(45) Date of Patent: Mar. 24, 2015

(54) FAULT DETECTION AND MONITORING IN BATTERIES

(75) Inventors: Stephen Brian Lynch, Portola Valley, CA (US); Scott A. Myers, San Francisco, CA (US); Fletcher R. Rothkopf, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 893 days.

(21) Appl. No.: 12/955,784

(22) Filed: Nov. 29, 2010

(65) Prior Publication Data

US 2012/0133521 A1 May 31, 2012

(51) Int. Cl.
| | |
|---|---|
| *H01M 2/00* | (2006.01) |
| *H01M 10/48* | (2006.01) |
| *G08B 21/00* | (2006.01) |
| *G08B 29/18* | (2006.01) |
| *G01R 31/02* | (2006.01) |
| *G08B 13/12* | (2006.01) |
| *H01M 10/42* | (2006.01) |
| *G01R 31/36* | (2006.01) |

(52) U.S. Cl.
CPC ............ *G08B 29/181* (2013.01); *G01R 31/024* (2013.01); *G08B 13/128* (2013.01); *H01M 10/425* (2013.01); *H01M 10/4257* (2013.01); *H01M 2010/4271* (2013.01); *H01M 10/48* (2013.01); *G01R 31/3606* (2013.01); *G01R 31/3627* (2013.01)

USPC ............................. 429/90; 429/61; 340/636.1

(58) Field of Classification Search
None
See application file for complete search history.

(56) References Cited

U.S. PATENT DOCUMENTS

| | | | | |
|---|---|---|---|---|
| 4,526,752 | A | * | 7/1985 | Perlman et al. ................ 422/401 |
| 4,727,006 | A | * | 2/1988 | Malinowski et al. ........... 429/50 |
| 2006/0008699 | A1 | * | 1/2006 | Um .................................. 429/90 |
| 2009/0115602 | A1 | * | 5/2009 | Lawson et al. ........... 340/539.17 |
| 2009/0123816 | A1 | * | 5/2009 | Jang ............................... 429/90 |

FOREIGN PATENT DOCUMENTS

JP            2000090896     *   3/2000

* cited by examiner

*Primary Examiner* — Ula C. Ruddock
*Assistant Examiner* — Matthew Van Oudenaren
(74) *Attorney, Agent, or Firm* — Brownstein Hyatt Farber Schreck, LLP

(57) ABSTRACT

The disclosed embodiments provide a battery pack that includes a fault-monitoring mechanism for detecting faults in the battery pack and indicating the faults to a user. The battery pack also includes a battery cell and enclosure material that encloses the battery cell. The fault may correspond to penetration of the battery pack, a puncture in the enclosure material, a short circuit within the battery cell, and/or a change in pressure within the battery pack. To detect the fault, the fault-monitoring mechanism may utilize a conductive mechanism, a color-changing mechanism, and/or a sensor mechanism in the battery pack.

16 Claims, 8 Drawing Sheets

FAULT DETECTION AND MONITORING IN BATTERIES

BACKGROUND

Field

The present embodiments relate to batteries for portable electronic devices. More specifically, the present embodiments relate to techniques for monitoring and detecting faults in batteries for portable electronic devices.

SUMMARY

The disclosed embodiments provide a battery pack that includes a fault-monitoring mechanism for detecting faults in the battery pack and indicating the faults to a user. The battery pack also includes a battery cell and enclosure material that encloses the battery cell. The fault may correspond to penetration of the battery pack, a puncture in the enclosure material, a short circuit within the battery cell, and/or a change in pressure within the battery pack. To detect the fault, the fault-monitoring mechanism may utilize a conductive mechanism, a color-changing mechanism, and/or a sensor mechanism in the battery pack.

In some embodiments, the conductive mechanism includes one or more conductive traces disposed within one or more layers of material inside the battery pack. As a result, the conductive mechanism may detect penetration of the battery pack from open circuits and/or changes in resistance in individual conductive traces, as well as short circuits between pairs of conductive traces.

In some embodiments, the color-changing mechanism includes one or more layers of enclosure material that change color upon exposure to air and/or in response to changes in temperature or mechanical stress. The color-changing mechanism may thus detect and indicate physical damage to the battery pack, puncturing of the enclosure material, and/or heat buildup in the battery pack.

In some embodiments, the sensor mechanism detects a change in pressure, temperature, and/or atmosphere within the battery pack using an air sensor, moisture sensor, temperature sensor, pressure sensor, strain gauge, and/or curvature gauge. Consequently, the sensor mechanism may detect punctures, swelling, and/or heat buildup in the battery pack.

To indicate the fault to the user, the fault-monitoring mechanism may generate an alert and/or disable use of a portable electronic device containing the battery pack. For example, the fault-monitoring mechanism may indicate the fault through a visual alert (e.g., color-changing mechanism), an audible alarm, and/or a notification to the operating system of the portable electronic device. Alternatively, the fault-monitoring mechanism may cause a safety circuit for the battery to disconnect the battery from the portable electronic device.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

The disclosed embodiments provide a battery pack that includes a fault-monitoring mechanism for detecting faults in the battery pack and indicating the faults to a user. The battery pack also includes a battery cell and enclosure material that encloses the battery cell. The fault may correspond to penetration of the battery pack, a puncture in the enclosure material, a short circuit within the battery cell, and/or a change in pressure within the battery pack. To detect the fault, the fault-monitoring mechanism may utilize a conductive mechanism, a color-changing mechanism, and/or a sensor mechanism in the battery pack.

Figure 1:
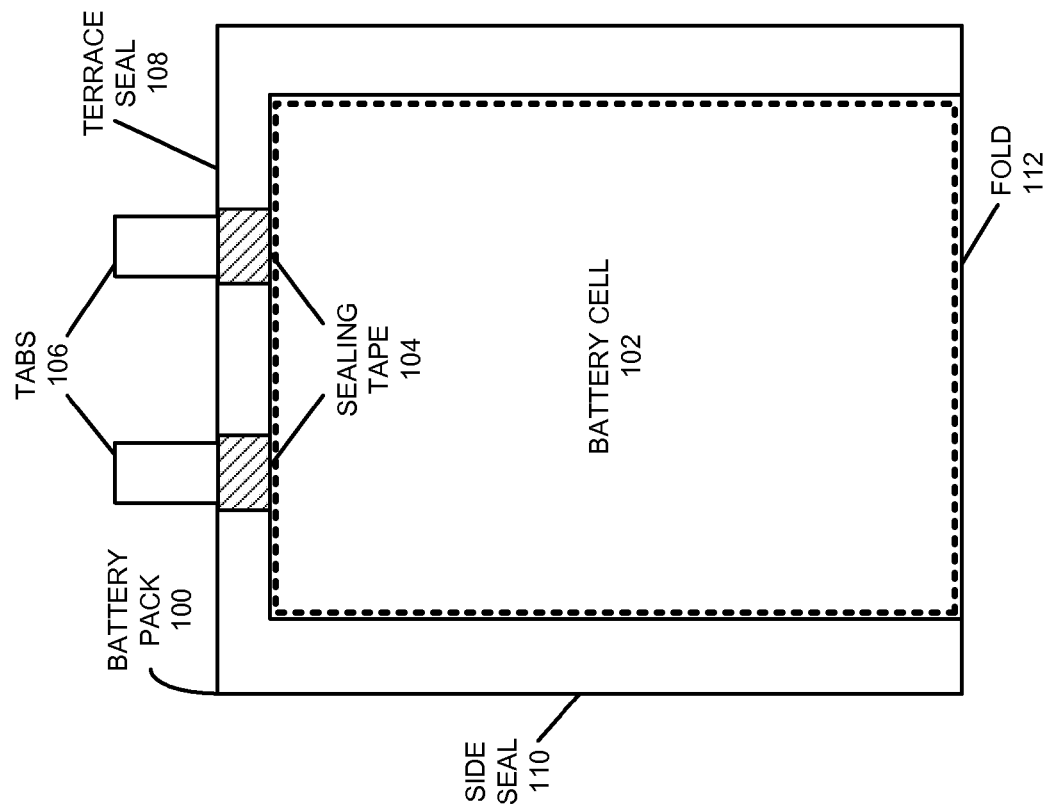
FIG. 1 shows a battery pack in accordance with an embodiment.

FIG. 1 shows a top-down view of a battery pack 100 in accordance with an embodiment. Battery pack 100 may correspond to a lithium-polymer battery that is used to power a portable electronic device. As a result, a battery cell 102 in battery pack 100 may correspond to a jelly roll containing a number of layers which are wound together, including a cathode with an active coating, a separator, and an anode with an active coating. More specifically, the jelly roll may include one strip of cathode material (e.g., aluminum foil coated with a lithium compound) and one strip of anode material (e.g., copper foil coated with carbon) separated by one strip of separator material (e.g., conducting polymer electrolyte). The cathode, anode, and separator layers may then be wound on a mandrel to form a spirally wound structure. Jelly rolls are well known in the art and will not be described further.

During assembly of battery pack 100, battery cell 102 is enclosed in a flexible pouch, which is formed by folding a flexible sheet along a fold line 112. For example, the flexible sheet may be made of aluminum with a polymer film, such as polypropylene. After the flexible sheet is folded, the flexible sheet can be sealed, for example by applying heat along a side seal 110 and along a terrace seal 108.

Battery pack 100 also includes a set of conductive tabs 106 coupled to the cathode and the anode. Conductive tabs 106 may extend through seals in the pouch (for example, formed using sealing tape 104) to provide terminals for battery pack 100. The pouch may then be enclosed in a hard case to complete the battery pack, or the pouch may be embedded within the enclosure of a portable electronic device, such as a laptop computer, tablet computer, mobile phone, personal digital assistant (PDA), digital camera, and/or portable media player.

In one or more embodiments, battery pack 100 includes a fault-monitoring mechanism that detects faults in battery pack 100. The fault-monitoring mechanism may include a conductive mechanism, color-changing mechanism, and/or sensor mechanism that allows faults associated with mechanical stress, physical damage, electrical shorts, and/or swelling to be detected. The fault-monitoring mechanism may additionally indicate the faults to a user by generating an alert and/or disabling use of the portable electronic device. Fault-monitoring mechanisms for battery packs are discussed in further detail below with respect to FIGS. 2-6.

Figure 2:
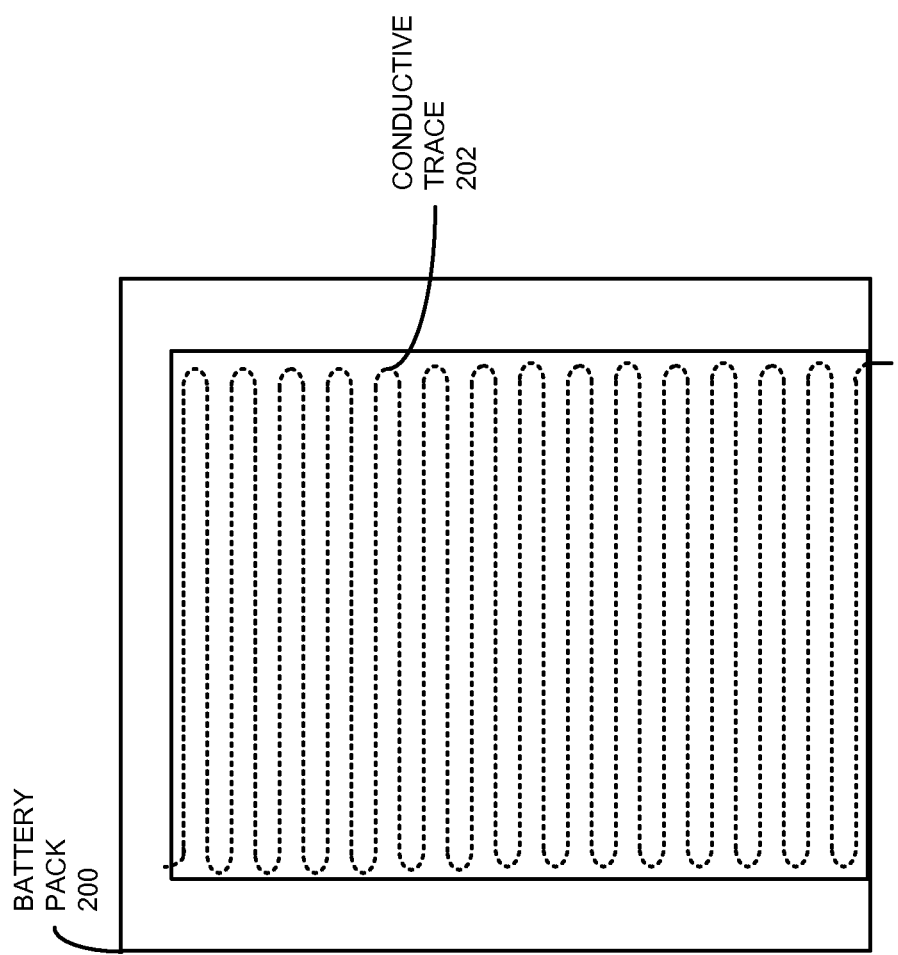
FIG. 2 shows a top-down view of a battery pack in accordance with an embodiment.

FIG. 2 shows a top-down view of a battery pack 200 in accordance with an embodiment. As shown in FIG. 2, a conductive trace 202 is disposed within battery pack 200. Conductive trace 202 may be disposed on enclosure material (e.g., a pouch) used to enclose battery pack 200. For example, conductive trace 202 may be printed or silkscreened onto a nylon or propylene layer of a pouch forming the enclosure for battery pack 200. On the other hand, conductive trace 202 may be disposed on a separate layer of material within battery pack 200. For example, conductive trace 202 may be printed onto a layer of polyamide that is placed within the enclosure for battery pack 200.

In one or more embodiments, conductive trace 202 provides a conductive mechanism for detecting penetration of battery pack 200. In addition, the penetration may be detected from an open circuit in conductive trace 202 and/or a change in resistance of conductive trace 202. For example, penetration of battery pack 200 may create a break in conductive trace 202 that is detected by a safety circuit for battery pack 200 as a change in resistance beyond a pre-specified threshold and/or an open circuit in conductive trace 202. The safety circuit may then generate an alert that notifies a user of the penetration (e.g., an audible alarm, a software alert, etc.), or the safety circuit may disable use of a portable electronic device containing battery pack 200 (e.g., by disconnecting battery pack 200).

Those skilled in the art will appreciate that the layout of conductive trace 202 may be based on a variety of patterns. For example, conductive trace 202 may form a helix that winds around a battery cell along the interior of the enclosure for battery pack 200. Conductive trace 202 may also include branches to facilitate penetration detection in various parts of battery pack 200. As discussed in further detail with respect to FIGS. 3-4, penetration detection in battery pack 200 may further be facilitated using multiple conductive traces and/or layers of conductive traces.

Figure 3:
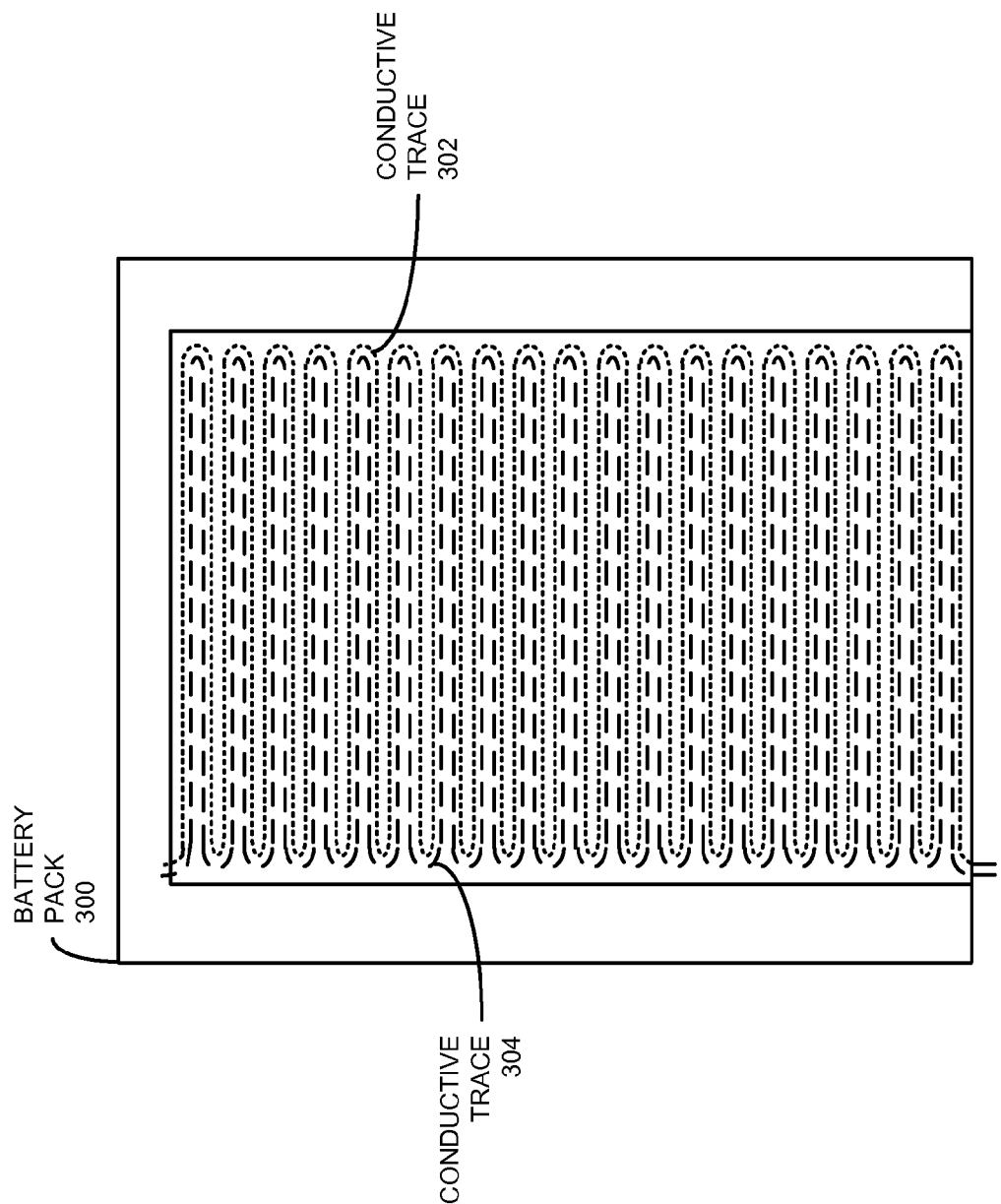
FIG. 3 shows a top-down view of a battery pack in accordance with an embodiment.

FIG. 3 shows a top-down view of a battery pack 300 in accordance with an embodiment. As with battery pack 200 of FIG. 2, battery pack 300 includes a conductive mechanism for detecting penetration of battery pack 300. However, battery pack 300 includes two conductive traces 302-304 instead of one. As a result, penetration of battery pack 300 may be detected from an open circuit and/or change in resistance in either conductive trace, as well as from a short circuit between conductive traces 302-304. For example, a short circuit between conductive traces 302-304 may indicate that a conductive object has penetrated a space between conductive traces 302-304 in battery pack 300.

Figure 4:
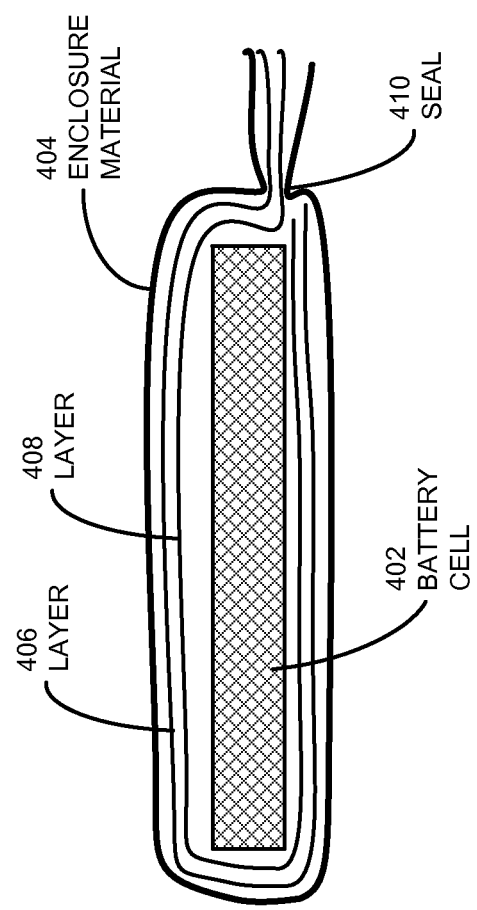
FIG. 4 shows a cross-sectional view of a battery pack in accordance with an embodiment.

FIG. 4 shows a cross-sectional view of a battery pack in accordance with an embodiment. As shown in FIG. 4, the battery pack includes a battery cell 402 and enclosure material 404 that encloses battery cell 402. As mentioned above, battery cell 402 may correspond to a jelly roll, and enclosure material 404 may form a flexible pouch that surrounds the jelly roll. For example, the battery pack may be formed by placing the jelly roll into the pouch and applying heat and/or pressure at a seal 410.

The battery pack additionally includes two layers 406-408 of material between battery cell 402 and enclosure material 404. In one or more embodiments, conductive traces are disposed on layers 406-408 to facilitate penetration detection in the battery pack. For example, a first conductive trace may be disposed on layer 406, and a second conductive trace may be disposed on layer 408. In addition, the two conductive traces may form a crosshatch pattern and/or other pattern that increases the likelihood that penetration of both layers 406-408 results in a short circuit between the two conductive traces. A short circuit between the first and second conductive traces may indicate that a conductive foreign object has penetrated both layers 406-408 of material and reached battery cell 402. In other words, a short between the two conductive traces may indicate a possible short circuit within battery cell 402 that is caused by a conductive foreign object piercing the electrode layers of battery cell 402.

Figure 5:
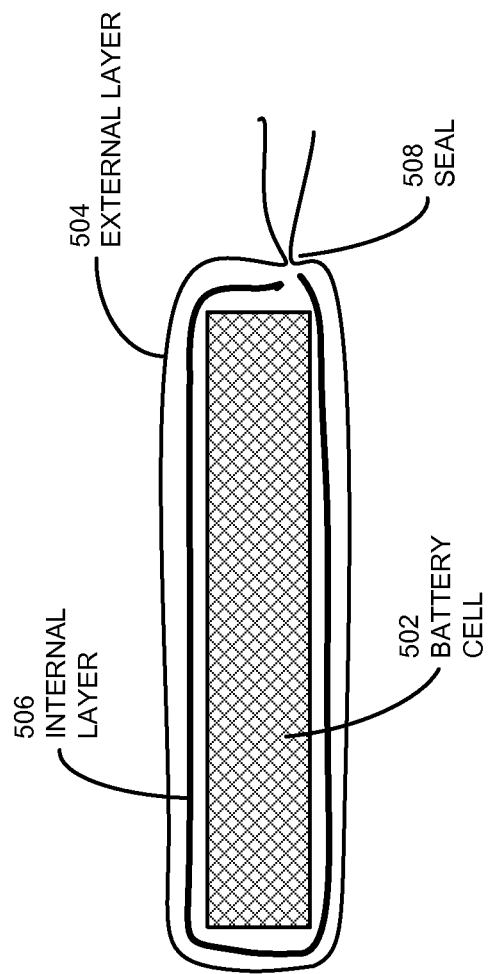
FIG. 5 shows a cross-sectional view of a battery pack in accordance with an embodiment.

FIG. 5 shows a cross-sectional view of a battery pack in accordance with an embodiment. The battery pack includes a battery cell 502 enclosed in two layers of enclosure material: an external layer 504 that includes a seal 508 for the battery pack, and an internal layer 506 between battery cell 502 and external layer 504.

The battery pack of FIG. 5 may provide a color-changing mechanism that is used to detect punctures in the battery pack. To enable puncture detection in the battery pack, external layer 504 may be transparent, and internal layer 506 may change color upon exposure to air. Because the battery pack may be assembled in an oxygen-free atmosphere, a color change in the internal layer 506 may indicate that air is entering the battery pack through a puncture in external layer 504.

Those skilled in the art will appreciate that the color-changing mechanism may utilize layers of other color-changing materials to detect and indicate other faults in the battery pack. For example, the enclosure material may include a layer of material that changes color in response to a change in temperature to enable detection of short circuits and/or other heat-generating faults in the battery pack. Similarly, the enclosure material may include a layer of mechanophore-linked material that changes color under mechanical stress to indicate physical damage to the battery pack.

Figure 6:
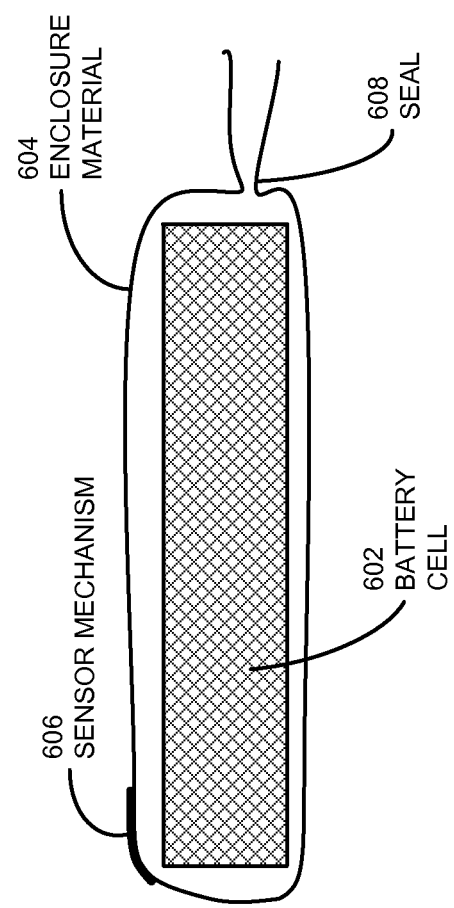
FIG. 6 shows a cross-sectional view of a battery pack in accordance with an embodiment.

FIG. 6 shows a cross-sectional view of a battery pack in accordance with an embodiment. The battery pack of FIG. 6 includes a battery cell 602, as well as an enclosure formed by enclosing battery cell 602 in enclosure material 604 and applying heat and/or pressure to a seal 608 in enclosure material 604.

The battery pack of FIG. 6 also includes a sensor mechanism 606 that is used to detect a fault in the battery pack. In one or more embodiments, sensor mechanism 606 detects a change in pressure within the battery pack. For example, sensor mechanism 606 may include a strain gauge and/or curvature gauge that is mounted on and/or embedded in enclosure material 604. An increase in strain and/or curvature may indicate a pressure change caused by swelling in the battery pack. If sensor mechanism 606 detects swelling beyond an acceptable threshold, a safety circuit for the battery pack may generate an alert and/or disable use of a portable electronic device containing the battery pack.

On the other hand, sensor mechanism 606 may be placed within the enclosure for the battery pack. For example, sensor mechanism 606 may include a pressure sensor that detects swelling in the battery pack as an increase in pressure inside the battery pack. Furthermore, sensor mechanism 606 may include functionality to detect other faults in the battery pack. For example, sensor mechanism 606 may include an air (e.g., oxygen, nitrogen, etc.) or moisture sensor that is used to detect punctures in enclosure material 604 and/or a temperature sensor that detects heat buildup (e.g., from a short circuit) in the battery pack.

Figure 7:
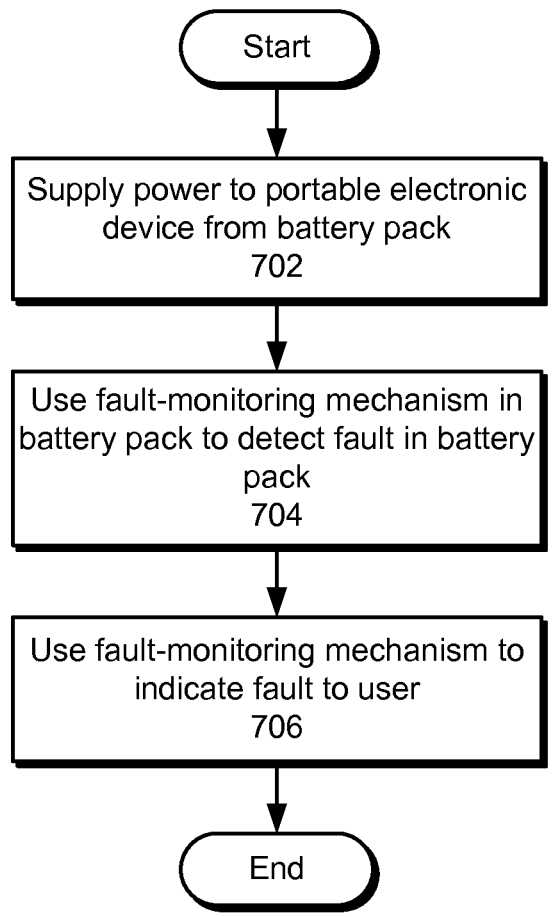
FIG. 7 shows a flowchart illustrating the process of facilitating use of a portable electronic device in accordance with an embodiment.

FIG. 7 shows a flowchart illustrating the process of facilitating use of a portable electronic device in accordance with an embodiment. In one or more embodiments, one or more of the steps may be omitted, repeated, and/or performed in a different order. Accordingly, the specific arrangement of steps shown in FIG. 7 should not be construed as limiting the scope of the embodiments.

First, power is supplied to the portable electronic device from a battery pack (operation 702). The portable electronic device may be a laptop computer, tablet computer, mobile phone, PDA, portable media player, digital camera, and/or other type of battery-powered electronic device. The battery pack may thus enable operation of the portable electronic device by supplying power to components (e.g., processor, memory, display, input/output (I/O) devices, etc.) in the portable electronic device.

Next, a fault-monitoring mechanism in the battery pack is used to detect a fault in the battery pack (operation 704) and indicate the fault to a user (operation 706). The fault may represent penetration of the battery pack, a puncture in the enclosure material of the battery pack, a short circuit inside the battery pack, and/or a change in pressure (e.g., swelling) within the battery pack.

To detect the fault, the fault-monitoring mechanism may utilize a conductive mechanism, a color-changing mechanism, and/or a sensor mechanism. The conductive mechanism may include one or more conductive traces disposed within one or more layers of material inside the battery pack. As a result, the conductive mechanism may detect penetration of the battery pack from open circuits and/or changes in resistance in individual conductive traces, as well as short circuits between pairs of conductive traces.

The color-changing mechanism may include one or more layers of enclosure material that change color upon exposure to air and/or in response to changes in temperature or mechanical stress. The color-changing mechanism may thus detect and indicate physical damage to the battery pack, puncturing of the enclosure material, and/or heat buildup in the battery pack.

The sensor mechanism may detect a change in pressure, temperature, or atmosphere within the battery pack using an air sensor, moisture sensor, temperature sensor, pressure sensor, strain gauge, and/or curvature gauge. Consequently, the sensor mechanism may detect punctures, swelling, and/or heat buildup in the battery pack.

To indicate the fault to the user, the fault-monitoring mechanism may generate an alert and/or disable use of the portable electronic device. For example, the fault-monitoring mechanism may indicate the fault through a visual alert (e.g., color-changing mechanism), an audible alarm, and/or a notification to the operating system of the portable electronic device. Alternatively, the fault-monitoring mechanism may cause a safety circuit for the battery to disconnect the battery from the portable electronic device.

Figure 8:
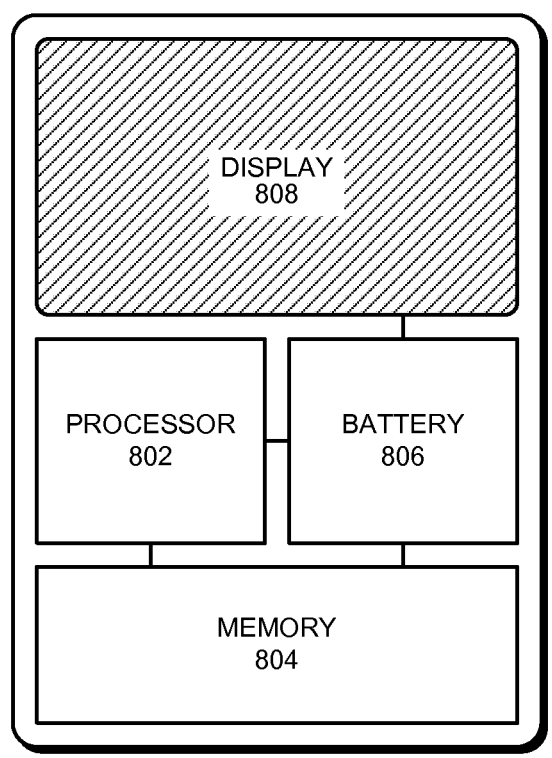
FIG. 8 shows a portable electronic device in accordance with an embodiment.

The above-described rechargeable battery pack can generally be used in any type of electronic device. For example, FIG. 8 illustrates a portable electronic device 800 which includes a processor 802, a memory 804 and a display 808, which are all powered by a battery 806. Portable electronic device 800 may correspond to a laptop computer, tablet computer, mobile phone, PDA, portable media player, digital camera, and/or other type of battery-powered electronic device. Battery 806 may correspond to a lithium-ion battery, lithium-polymer battery, and/or other type of rechargeable battery. In addition, battery 806 may include one or more battery cells in a battery pack. The battery pack may include a fault-monitoring mechanism that detects and indicates a fault in the battery pack using a conductive mechanism, color-changing mechanism, and/or sensor mechanism.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A battery pack, comprising:
    a battery cell;
    enclosure material which encloses the battery cell; and
    a fault-monitoring mechanism configured to:
        detect a fault in the battery pack using a sensor mechanism including:
            a first conductive trace on a first layer within the battery pack;
            a second conductive trace on a second layer within the battery pack;
            wherein the fault is detected from an open circuit in the first or second conductive trace or a change in resistance of the first or second conductive trace or a short circuit between the first and second conductive traces.

2. The battery pack of claim 1, wherein the fault-monitoring mechanism indicates the fault to the user by:
    generating an alert; or
    disabling use of the portable electronic device.

3. The battery pack of claim 2 wherein the alert includes an audible alarm.

4. The battery pack of claim 2 wherein the alert includes a software alert.

5. The battery pack of claim 2 wherein the alert includes a visual alert.

6. The battery pack of claim 2 wherein the visual alert includes a color changing mechanism.

7. The battery pack of claim 1 wherein the fault monitoring mechanism further includes a pressure sensor.

8. The battery pack of claim 7 wherein the pressure sensor includes a strain gauge.

9. The battery pack of claim 7 wherein the pressure sensor includes a curvature gauge.

10. The battery pack of claim 1 wherein the fault monitoring mechanism is configured to indicate the fault to a user.

11. A method for facilitating use of a portable electronic device, comprising:
supplying power to the portable electronic device from a battery pack, said battery pack including a first conductive trace on a first layer within the battery pack and a second conductive trace on a second layer within the battery pack; and
using a fault-monitoring mechanism in the battery pack to:
detect a fault in the battery pack using a sensor mechanism for:
sensing either an open circuit or a change in resistance in either said first conductive trace or said second conductive trace; or
sensing a short circuit between said first and second conductive traces.

12. The battery pack of claim 11 further including the step of using the fault monitoring mechanism to indicate the fault to a user.

13. The method of claim 12, wherein the fault-monitoring mechanism indicates the fault to the user by:
generating an alert; or
disabling use of the portable electronic device.

14. A portable electronic device, comprising:
a set of components powered by a battery pack; and
the battery pack comprising:
a battery cell;
enclosure material which encloses the battery cell; and
a fault-monitoring mechanism configured to:
detect a fault in the battery pack using a sensor mechanism including:
a first conductive trace on a first layer within the battery pack;
a second conductive trace on a second layer within the battery pack;
wherein the fault is detected from an open circuit in the first or second conductive trace or a change in resistance of the first or second conductive trace or a short circuit between the first and second conductive traces.

15. The battery pack of claim 14 wherein wherein the fault monitoring mechanism is configured to indicate the fault to a user.

16. The portable electronic device of claim 15, wherein the fault-monitoring mechanism indicates the fault to the user by:
generating an alert; or
disabling use of the portable electronic device.

\* \* \* \* \*